United States Patent
Iwasaki et al.

(10) Patent No.: US 7,807,956 B2
(45) Date of Patent: Oct. 5, 2010

(54) CURRENT DETECTION CIRCUIT

(75) Inventors: Tatsuya Iwasaki, Kyoto (JP); Koki Tamakawa, Kyoto (JP); Isao Yamamoto, Kyoto (JP)

(73) Assignee: Rohm Co., Ltd. (JP)

( * ) Notice: Subject to any disclaimer, the term of this patent is extended or adjusted under 35 U.S.C. 154(b) by 163 days.

(21) Appl. No.: 12/254,470

(22) Filed: Oct. 20, 2008

(65) Prior Publication Data

US 2009/0108178 A1    Apr. 30, 2009

(30) Foreign Application Priority Data

Oct. 18, 2007   (JP)   ............................. 2007-270940

(51) Int. Cl.
*H01J 40/14* (2006.01)
(52) U.S. Cl. ........................... 250/214 R; 250/214 AG; 250/214 SW; 323/271; 327/490
(58) Field of Classification Search ............. 250/214 R, 250/214 A, 214 AG, 214 SW, 214 C, 206; 323/268, 271, 282; 327/478, 490, 514
See application file for complete search history.

(56) References Cited

U.S. PATENT DOCUMENTS

2007/0296386 A1 * 12/2007 Umeki ........................ 323/284

FOREIGN PATENT DOCUMENTS

| JP | 06-029758 | 2/1994 |
| JP | 2006-339458 | 12/2006 |
| JP | 2005-216984 | 8/2008 |

\* cited by examiner

*Primary Examiner*—Kevin Pyo
(74) *Attorney, Agent, or Firm*—Cantor Colburn LLP

(57) ABSTRACT

A current detection circuit detects photoelectric current that flows through a phototransistor, and outputs a current, which is proportional to the photoelectric current, via an output terminal. An input-side transistor is a PNP bipolar transistor, and is provided on a current path for the phototransistor. Output-side transistors are PNP bipolar transistors. The base terminals thereof are connected to that of the input-side transistor so as to form a common base terminal, and the emitter terminals thereof are connected to that of the input-side transistor so as to form a common emitter terminal, thereby forming a current mirror circuit. Each of first switches is provided between the collector of the corresponding output-side transistor and an output terminal. Each of second switches is provided between the collector of the corresponding output-side transistor and the ground terminal. A control unit controls the ON/OFF operations of the first switches and the second switches.

7 Claims, 2 Drawing Sheets

CURRENT DETECTION CIRCUIT

BACKGROUND OF THE INVENTION

1. Field of the Invention

The present invention relates to a current detection circuit for detecting electric current that flows through a photoreceptor device.

2. Description of the Related Art

In various kinds of electronic apparatuses, light input externally is measured, and signal processing is performed based upon the received light amount thus measured. Examples of such electronic apparatuses include an illuminance sensor, a photoreceptor apparatus employed in an infrared ray remote controller, and so forth. Examples of photoreceptor devices for receiving light which are widely used include a phototransistor, a photodiode, a CCD (Charge Coupled Device), etc.

The phototransistor and the photodiode output electric current according to the light thus received. Accordingly, the photoreceptor apparatus amplifies the current that flows through such a photoreceptor device, or performs signal processing such as voltage conversion.

[Patent Document 1]
Japanese Patent Application Laid Open No. 2005-216984

[Patent Document 2]
Japanese Patent Application Laid Open No. H6-29758

[Patent Document 3]
Japanese Patent Application Laid Open No. 2006-339458

In some cases, the current that flows through a photoreceptor device is amplified using a current mirror circuit, and signal processing is performed based upon the current thus amplified. It should be noted that the concept of "amplification" as used here includes amplification with a mirror ratio of 1 or less, in addition to amplification with a mirror ratio which is greater than 1.

In a case in which a current detection circuit must provide high-speed response operation, there is a need to provided bipolar transistors to a current mirror circuit. However, a current mirror circuit configured using the bipolar transistors has a problem as follows. That is to say, with such an arrangement, when the mirror ratio of the current mirror circuit is switched, the base current of each transistor changes. This leads to poor linearity of the mirror ratio with respect to the input current, and reduces the precision of the mirror ratio (which will also be referred to as "mirror ratio precision" hereafter).

Such a problem can be solved by providing, to the current mirror circuit, a compensation circuit for compensating for the base current. However, such an arrangement has a poor performance in a state in which the power supply voltage is low.

SUMMARY OF THE INVENTION

The present invention has been made in order to solve such a problem. Accordingly, it is a general purpose of the present invention to provide a current detection circuit having improved linearity and improved precision of the mirror ratio.

An embodiment of the present invention relates to a current detection circuit which detects a current that flows through a photoreceptor device. The current detection circuit includes: an output terminal via which a current, which is proportional to the current that flows through the photoreceptor device, is output; an input-side transistor which is a PNP bipolar transistor provided on a current path for the photoreceptor device; multiple output-side transistors which are PNP bipolar transistors with the base terminals being connected to that of the input-side transistor so as to form a common base terminal, and with the emitter terminals being connected to that of the input-side transistor so as to form a common emitter terminal, thereby forming a current mirror circuit; multiple first switches each of which is provided for a corresponding one of the multiple output-side transistors, and each of which is provided between the collector of the corresponding output-side transistor and the output terminal; multiple second switches each of which is provided for a corresponding one of the multiple output-side transistors, and each of which is provided between the collector of the corresponding output-side transistor and the ground terminal; and a control unit which controls the ON/OFF operations of the multiple first switches and the multiple second switches.

With such an embodiment, by selecting a combination of the ON/OFF states of the first switches, the gain (mirror ratio) of the current detection circuit can be suitably switched. Furthermore, by controlling the ON/OFF operations of the second switches, each of the output-side transistors, which cannot contribute to the current amplification operation of the current mirror circuit, can be switched between a conducting state and a non-conducting state. Thus, by selecting the combination of the ON/OFF states of the first switches and the second switches, such an arrangement improves the linearity and the precision of the mirror ratio.

The ON/OFF operations of the first switches and the second switches may be preferably performed such that the sum of the base currents of the multiple output-side transistors is maintained at a constant value under the condition that the current that flows through the photoreceptor device is maintained at a constant value.

Such an arrangement maintains the base current at a constant value, thereby improving the precision of the mirror ratio of the current mirror circuit and the linearity thereof.

Also, the control unit may complementarily perform the ON/OFF operations of the first switch and the second switch associated to the same output-side transistor. With such an arrangement, a current, which corresponds to the current that flows through the input-side transistor, always flows through each of the multiple output-side transistors. Thus, such an arrangement maintains the base current of each transistor at a constant value regardless of the mirror ratio, thereby improving the linearity.

Another embodiment of the present invention relates to a photoreceptor apparatus. The photoreceptor apparatus includes: a photoreceptor device; the above-described current detection circuit; and a control unit which controls the ON/OFF operations of the first switches and the second switches of the current detection circuit. The photoreceptor apparatus detects the light amount received by the photoreceptor device, based upon the current output from the output terminal of the current detection circuit.

Yet another embodiment of the present invention relates to an electronic apparatus. The electronic apparatus includes: an light emitting device; and the photoreceptor apparatus which detects returning light reflected from an external subject after the light emitting device emits the light.

Also, the light emitting device may be a flash. After the light amount of the reflected light detected by the photoreceptor apparatus reaches a predetermined value, the light emitting operation may be stopped.

With such an embodiment, the electronic apparatus may further include an image capturing unit having a zoom function. Also, the control unit may switch the ON/OFF operations of the first switches and the second switches based upon the zoom state of the image capturing unit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
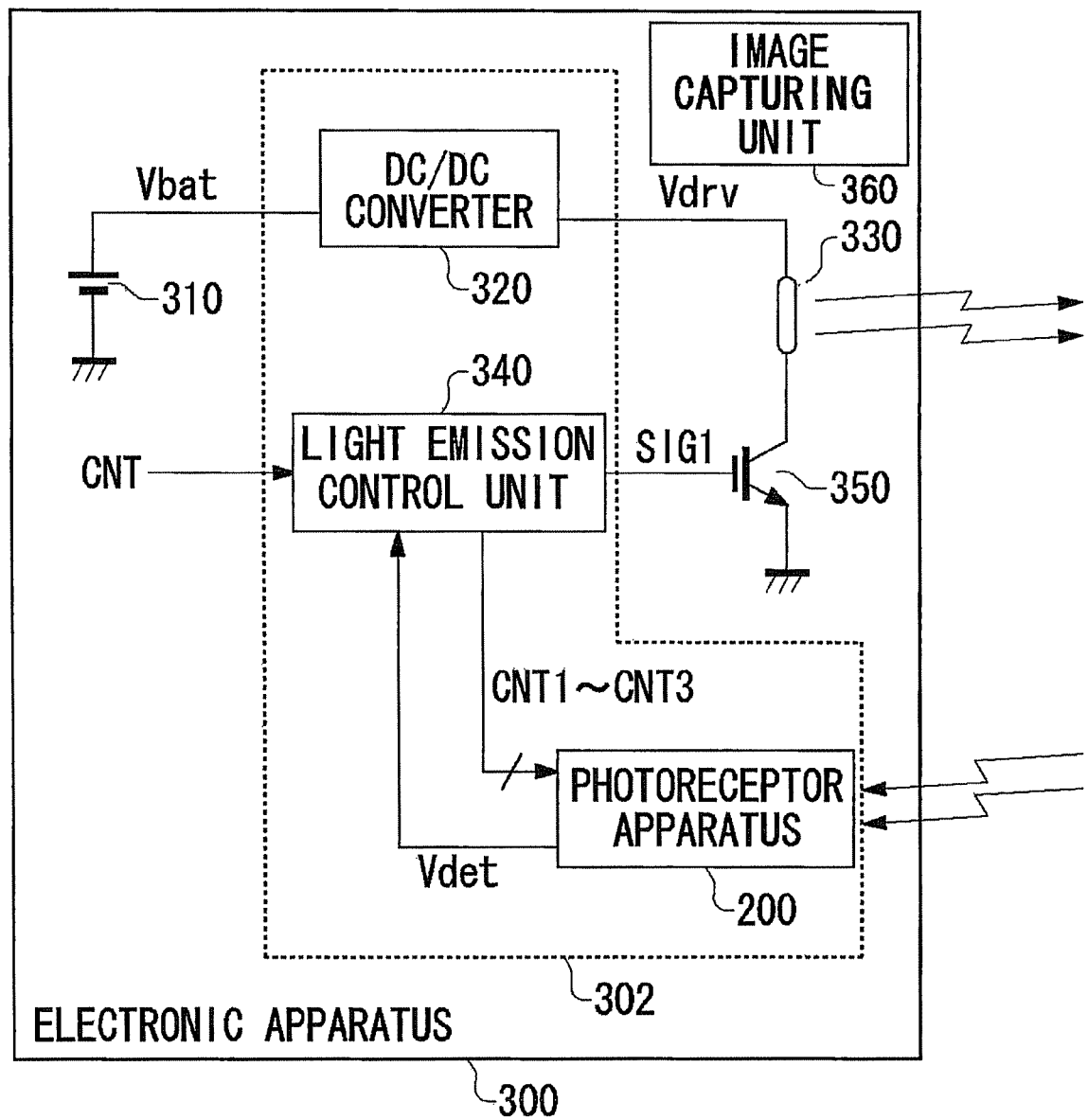
FIG. 1 is a diagram which shows a configuration of an electronic apparatus according to an embodiment.

FIG. 1 is a diagram which shows a configuration of an electronic apparatus 300 according to the present embodiment. The electronic apparatus 300 according to the present embodiment is a cellular phone terminal with a built-in camera including a flash, for example. The electronic apparatus 300 includes a photoreceptor apparatus which detects reflected returning light after the flash has emitted light. Upon detection of a predetermined light amount, the electronic apparatus 300 instructs the flash to stop light emission.

The electronic apparatus 300 includes a battery 310, a DC/DC converter 320, a light emitting device 330, a light emission control unit 340, a light emission control transistor 350, an image capturing unit 360, and a photoreceptor apparatus 200.

The battery 310 is a lithium-ion battery or the like, which outputs the battery voltage Vbat of around 3 V to 4 V. The DC/DC converter 320 boosts the battery voltage Vbat up to around 300 V in order to drive the light emitting device 330. The driving voltage Vdrv generated by the DC/DC converter 320 is supplied to the light emitting device 330.

For example, the light emitting device 330 is a xenon tube lamp. The driving voltage Vdrv boosted up to around 300 V is applied to one terminal of the light emitting device 330. The other terminal of the light emitting device 330 is connected to the light emission control transistor 350. As the light emission control transistor 350, an IGBT (Insulated Gate Bipolar Transistor) or the like, which exhibits high voltage endurance, is employed. A light emission control signal SIG1 output from the light emission control unit 340 is input to the gate of the light emission control transistor 350.

The light emission control unit 340 receives a control signal CNT as an input signal, which is switched to the high-level state synchronously with the shutter timing of the image capturing unit 360 when the user turns on the flash. The light emission control unit 340 switches the light emission control signal SIG1 to the high level state according to the control signal CNT, as described later. When the light emission control signal SIG1 is switched to the high-level state, after a delay time τ elapses, the light emission control transistor 350 is switched to the ON state, thereby instructing the light emitting device 330 to emit light. The delay time τ is determined by the properties of the xenon tube lamp.

Furthermore, the light emission control unit 340 generates a first control signal CNT1 through a third control signal CNT3 based upon the control signal CNT, and outputs these signals to the photoreceptor apparatus 200. The photoreceptor apparatus 200 transits to the standby state for light reception according to the first control signal CNT1 through the third control signal CNT3 output from the light emission control unit 340. Subsequently, the photoreceptor apparatus 200 detects the light which has been emitted from the light emitting device 330, and which has returned from an external object by reflection, and outputs the light thus detected in the form of a detection voltage Vdet. When the detection voltage Vdet exceeds a predetermined threshold voltage Vth, i.e., when the amount of the reflected light thus detected reaches a predetermined light amount, the light emission control unit 340 switches the light emission control signal SIG1 to the low level state, which instructs the light emitting device 330 to stop light emission.

Figure 2:
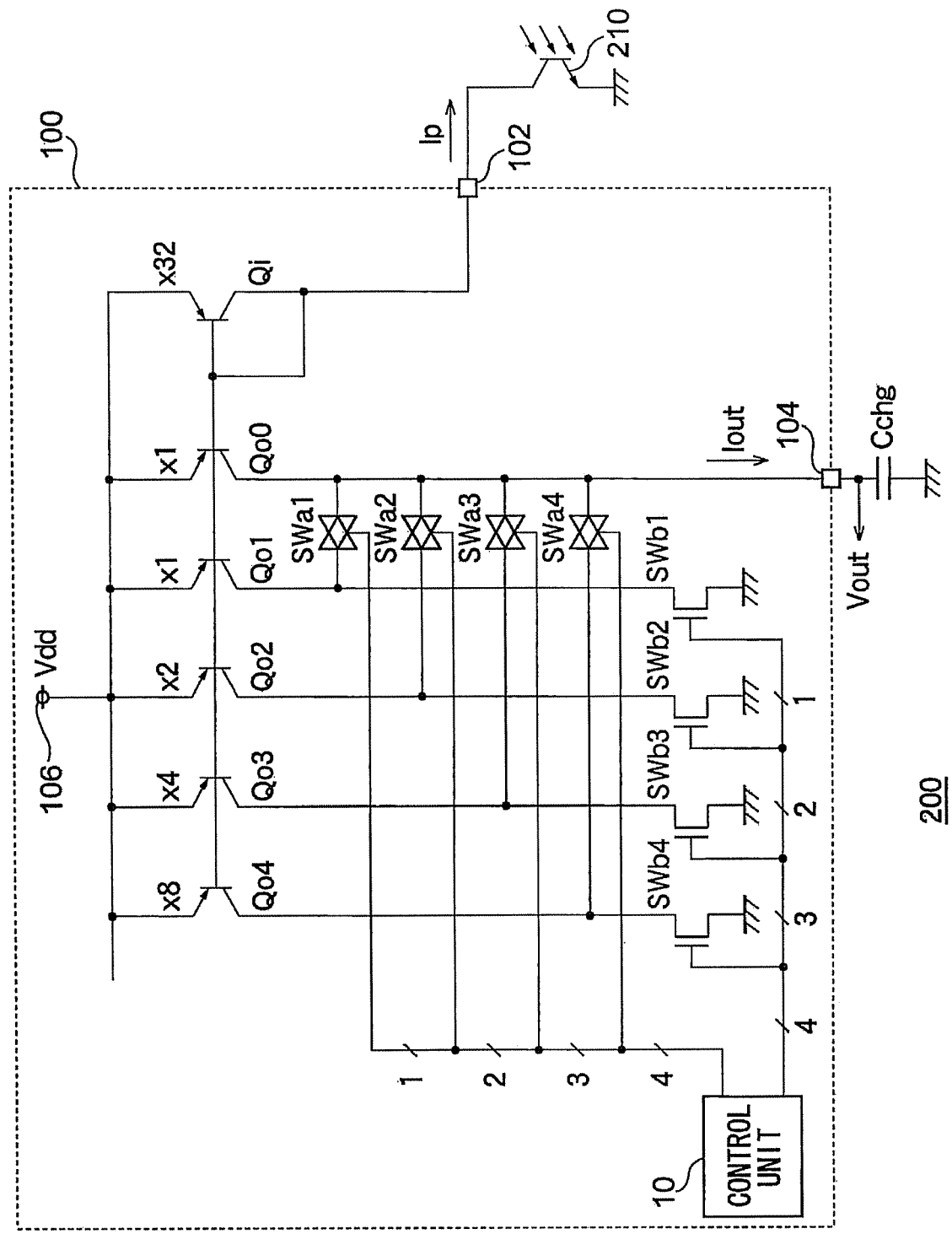
FIG. 2 is a circuit diagram which shows a configuration of a photoreceptor apparatus according to the embodiment.

Next, detailed description will be made regarding a configuration of the photoreceptor apparatus 200 according to the present embodiment. FIG. 2 is a circuit diagram which shows a configuration of the photoreceptor apparatus 200 according to the present embodiment. The photoreceptor apparatus 200 includes a current detection circuit 100, a phototransistor 210, and a charging capacitor Cchg. The current detection circuit 100 is an IC which is monolithically integrated on a single semiconductor substrate. With the present embodiment, the current detection circuit 100 is monolithically integrated in the form of a function IC 302 along with the light emission control unit 340, the control circuit for the DC/DC converter 320, and so forth, shown in FIG. 1.

The phototransistor 210 is provided as a photoreceptor device, through which photo-electric current Ip flows according to the input light. The emitter of the phototransistor 210 is grounded, and the collector thereof is connected to a detection terminal 102 of the current detection circuit 100.

The current detection circuit 100 detects the photo-electric current Ip that flows through the phototransistor 210 connected to the detection terminal 102. Specifically, the current detection circuit 100 amplifies the photo-electric current Ip with a gain α, and outputs the current Iout thus amplified via an output terminal 104. A charging capacitor Cchag is connected to the output terminal 104. The charging capacitor Cchag is charged using the output current Iout. The charging capacitor Cchg stores charge according to the received light amount. The voltage Vout at one terminal of the charging capacitor Cchg is output as a signal that corresponds to the received light amount.

The current detection circuit 100 includes an input-side transistor Qi, output-side transistors Qo0 through Qo4, first switches SWa1 through SWa4, second switches SWb1 through SWb4, and the output terminal 104.

The current Iout, which is proportional to the photo-electric current Ip that flows through the phototransistor 210, is output via the output terminal 104. The input-side transistor Qi is a PNP bipolar transistor provided on a current path for the phototransistor 210. Specifically, the emitter of the input-side transistor Qi is connected to a power supply terminal 106. Furthermore, the base and the collector of the input-side transistor Qi are connected to each other so as to form a common terminal.

Each of the multiple output-side transistors Qo0 through Qo4 is a transistor of the same type as that of the input-side transistor Qi, i.e., is a PNP bipolar transistor. The base of each of the output-side transistors Qo0 through Qo4 is connected to the base of the input-side transistor Qi so as to form a common terminal. Furthermore, the emitter thereof is connected to the emitter of the input-side transistor Qi so as to form a common terminal. Such an arrangement forms a current mirror circuit. The collector of the input-side transistor Qi0 is connected to the output terminal 104.

The multiple first switches SWa1 through SWa4 (which will collectively be referred to as "first switch SWa" hereafter as appropriate) are provided to the multiple output-side transistors Qo1 through Qo4, respectively. The i'th first switch SWa1 is provided between the collector of the corresponding output-side transistor Qoi and the output terminal 104. In the present embodiment, each first switch SWa is a transfer gate. However, the configuration thereof is not restricted in particular.

The multiple second switches SWb1 through SWb4 (which will collectively be referred to as "second switch SWb" hereafter as appropriate) are provided to the multiple output-side transistors Qo1 through Qo4, respectively. The i'th second switch SWbi is provided between the collector of the corresponding output-side transistor Qoi and the ground terminal. In the present embodiment, each second switch SWb is an N-type MOSFET (Metal Oxide Semiconductor Field Effect Transistor). However, the configuration thereof is not restricted in particular.

The number of the sets of an output-side transistors Qo, a corresponding first switch SWa, and a corresponding second switch SWb, is not restricted to four. Rather, a desired number of sets of these components may be employed.

The control unit 10 controls the ON/OFF operations of the multiple first switches SWa and the multiple second switches SWb.

For example, let us consider a case in which a circuit is designed such that the size ratio between the input-side transistor Qi and each of the output-side transistor Qo is set to a power of two. The gain α of the current detection circuit 100 is determined based upon the size ratio between these transistors. With the size of the input-side transistor and the size of the output-side transistor as Si and So, respectively, the maximum value of the current gain α is represented by the Expression; αmax=ΣSo/Si. On the other hand, the minimum value thereof is represented by the Expression; αmin=So0/Si.

In the example shown in FIG. 2, the size ratio Si:So0:So1:So2:So3:So4 is 32:1:1:2:4:8. Accordingly, αmax is set to 1/2, and αmin is set to 1/32.

With such a configuration described above, by selecting a combination of the ON/OFF states of the first switches SWa1 through SWa4, the gain α (mirror ratio) of the current detection circuit 100 can be suitably switched. Furthermore, by controlling the ON/OFF operations of the second switches SWb, each of the output-side transistors, which do not contribute to the current amplification operation of the current mirror circuit, can be switched between a conducting state and a non-conducting state. Thus, by selecting the combination of the ON/OFF states of the first switches SWa and the second switches SWb, such an arrangement allows the mirror ratio to be switched while suppressing poor linearity of the mirror ratio and deterioration in the precision of the mirror ratio.

With the embodiment, the control unit 10 complementarily performs ON/OFF operations of the first switch SWai and the second switch SWbi which correspond to the same output-side transistor Qoi. That is to say, when the i'th switches SWai is in the ON state, the second switch SWbi is in the OFF state. With such an arrangement, the collector of the i'th output-side transistor Qoi is connected to either the output terminal 104 or the ground terminal. Accordingly, with such an arrangement in which the control unit 10 controls these switches using this method, the collector (emitter) current, which is proportional to the photoelectric current Ip, passes through all the output-side transistors Qo.

That is to say, the collector current of each of the output-side transistors Qo1 through Qo4 is maintained at a constant value regardless of the states of the first switches SWa which are switched according to the gain α. Thus, such an arrangement maintains the base current of each output-side transistor at a constant value. As a result, such an arrangement improves the precision and linearity of the mirror ratio of the current mirror circuit having such a configuration including the input-side transistor Qi and the output-side transistors Qo.

Returning to FIG. 1, description will be made regarding the operation of the current detection circuit 100 and the overall operation of the electronic apparatus 300. The image capturing unit 360 has a zoom function. In general, there is a difference in the distance between the electric device 300 and the subject, between the state in which the zoom function is set to the wide-angle side and the state in which the zoom function is set to the telephoto side. The photoreceptor apparatus 200 detects reflected returning light after the light emitting device 330 has emitted light. Accordingly, the received light amount changes according to the state of the zoom operation, which changes the photoelectric current Ip that flows through the phototransistor 210.

In a case in which the current detection circuit 100 is employed in the electronic apparatus 300 mounting the image capturing unit 360 having a zoom function, the control unit 10 switches the ON/OFF states of the first switches SWa and the second switches SWb according to the state of the zoom operation of the image capturing unit 360.

By performing such a control operation, such an arrangement controls the gain α of the current detection circuit 100 according to the intensity of the reflected light from the subject. Thus, such an arrangement suitably adjusts the level of the voltage Vout output from the output terminal 104.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding an arrangement in which the charging capacitor Cchg is connected to the output terminal 104. Also, a resistor may be connected in stead of the charging capacitor Cchg. With such an arrangement, the voltage drop, which occurs at the resistor and which is proportional to the output current Iout, can be used as the voltage Vout.

In FIG. 2, the output-side transistor Qo0, to which no first switch SWa is connected, is provided. Also, an arrangement may be made which does not have such an output-side transistor Qo0.

In the embodiment, the phototransistor 210 is employed as a photoreceptor device. Also, a photodiode or an illuminance sensor may be employed instead of the phototransistor.

Description has been made in the embodiment regarding an arrangement in which the photoreceptor apparatus 200 and the light emission control unit 340 are monolithically integrated. Also, a part thereof may be provided in the form of discrete components. Which parts are to be provided in the form of an integrated circuit should be determined based upon costs, the occupied area, usage, etc.

The application of the current detection circuit 100 or the electronic apparatus 300 employing the photoreceptor apparatus 200 according to the present embodiment is not restricted to the aforementioned cellular phone terminal. Also, the current detection circuit 100 or the electronic apparatus 300 employing the photoreceptor apparatus 200 according to the present embodiment can be widely employed in various apparatuses which detect light using a photodiode or a phototransistor, such as an illuminance sensor, an infrared ray communication apparatus, etc.

While the preferred embodiments of the present invention have been described using specific terms, such description is for illustrative purposes only, and it is to be understood that changes and variations may be made without departing from the spirit or scope of the appended claims.

What is claimed is:

1. A current detection circuit which detects a current that flows through a photoreceptor device, comprising:
    an output terminal via which a current, which is proportional to the current that flows through the photoreceptor device, is output;
    an input-side transistor which is a PNP bipolar transistor provided on a current path for the photoreceptor device;
    a plurality of output-side transistors which are PNP bipolar transistors with the base terminals being connected to that of the input-side transistor so as to form a common base terminal, and with the emitter terminals being connected to that of the input-side transistor so as to form a common emitter terminal, thereby forming a current mirror circuit;
    a plurality of first switches each of which is provided for a corresponding one of the plurality of output-side transistors, and each of which is provided between the collector of the corresponding output-side transistor and the output terminal;
    a plurality of second switches each of which is provided for a corresponding one of the plurality of output-side transistors, and each of which is provided between the collector of the corresponding output-side transistor and the ground terminal; and
    a control unit which controls the ON/OFF operations of the plurality of first switches and the plurality of second switches.

2. A current detection circuit according to claim 1, wherein the control unit controls the ON/OFF operations of the first switches and the second switches such that the sum of the base currents of the plurality of output-side transistors is maintained at a constant value under the condition that the current that flows through the photoreceptor device is maintained at a constant value.

3. A current detection circuit according to claim 2, wherein the control unit complementarily performs the ON/OFF operations of the first switch and the second switch associated to the same output-side transistor.

4. A photoreceptor apparatus comprising:
    a photoreceptor device; and
    a current detection circuit according to claim 1,
    wherein the light amount received by the photoreceptor device is detected based upon the current output from the output terminal of the current detection circuit.

5. An electronic apparatus comprising:
    an light emitting device; and
    a photoreceptor apparatus according to claim 4, which detects returning light reflected from an external subject after the light emitting device emits the light.

6. An electronic apparatus according to claim 5, wherein the light emitting device is a flash,
    and wherein, after the light amount of the reflected light detected by the photoreceptor apparatus reaches a predetermined value, the light emitting operation is stopped.

7. An electronic apparatus according to claim 6, further including an image capturing unit having a zoom function,
    wherein the control unit switches the ON/OFF operations of the first switches and the second switches based upon the zoom state of the image capturing unit.

* * * * *